United States Patent
Huang et al.

(10) Patent No.: US 10,032,640 B1
(45) Date of Patent: Jul. 24, 2018

(54) FORMATION OF SEMICONDUCTOR STRUCTURE WITH A PHOTORESIST CROSS LINK AND DE-CROSS LINK PROCESS

(71) Applicant: Taiwan Semiconductor Manufacturing, Co., Ltd., Hsinchu (TW)

(72) Inventors: Chien-Hua Huang, Miaoli County (TW); Chung-Ju Lee, Hsinchu (TW); Ming-Hui Weng, New Taipei (TW); Tzu-Hui Wei, Zhubei (TW)

(73) Assignee: Taiwan Semiconductor Manufacturing Co., Inc., Hsinchu (TW)

( * ) Notice: Subject to any disclaimer, the term of this patent is extended or adjusted under 35 U.S.C. 154(b) by 0 days.

(21) Appl. No.: 15/628,114

(22) Filed: Jun. 20, 2017

(51) Int. Cl.
*H01L 21/308* (2006.01)

(52) U.S. Cl.
CPC ...... *H01L 21/3086* (2013.01); *H01L 21/3081* (2013.01)

(58) Field of Classification Search
CPC ................ H01L 21/3086; H01L 21/3081
See application file for complete search history.

(56) References Cited

U.S. PATENT DOCUMENTS

| | | | |
|---|---|---|---|
| 8,796,666 B1 | 8/2014 | Huang et al. | |
| 9,012,132 B2 | 4/2015 | Chang | |
| 9,028,915 B2 | 5/2015 | Chang et al. | |
| 9,093,530 B2 | 7/2015 | Huang et al. | |
| 9,146,469 B2 * | 9/2015 | Liu | G03F 7/092 |
| 9,213,234 B2 | 12/2015 | Chang | |
| 9,223,220 B2 * | 12/2015 | Chang | G03F 7/168 |
| 9,256,133 B2 | 2/2016 | Chang | |
| 9,536,759 B2 | 1/2017 | Yang et al. | |
| 9,548,303 B2 | 1/2017 | Lee et al. | |
| 2001/0055731 A1 * | 12/2001 | Irie | G03F 7/168 430/313 |
| 2002/0036183 A1 * | 3/2002 | Shibata | G03F 7/40 216/44 |

* cited by examiner

*Primary Examiner* — Karen Kusumakar
(74) *Attorney, Agent, or Firm* — Sterne, Kessler, Goldstein & Fox P.L.L.C.

(57) ABSTRACT

Methods of fabricating a semiconductor structure using a photoresist cross link process and a photoresist de-cross link process are described. A cross link bottom layer is employed during the fabricating process and the photoresist de-cross link process de-cross links the cross link bottom layer before the bottom layer is removed. The incorporation of the photoresist de-cross link process with the usage of the cross link bottom layer provides a cost effective and low defect level solution to fabricate the semiconductor structure.

20 Claims, 23 Drawing Sheets

FORMATION OF SEMICONDUCTOR STRUCTURE WITH A PHOTORESIST CROSS LINK AND DE-CROSS LINK PROCESS

BACKGROUND

Semiconductor technologies are continuously progressing to smaller feature sizes and higher device density. As the features sizes shrink, tolerances in the manufacturing processes are reduced. One example is the tolerance for defects. As the device density increases, defects introduced during the manufacturing process are more likely to cause failures (e.g., shorts/opens). Manufacturing processes such as, for example, photolithography and etching can introduce defects because of the usage of photoresist during the photolithography process and the generation of byproducts during the etching process. As a result, reducing the level of defects is crucial in improving the manufacturability of the semiconductor devices.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1A:
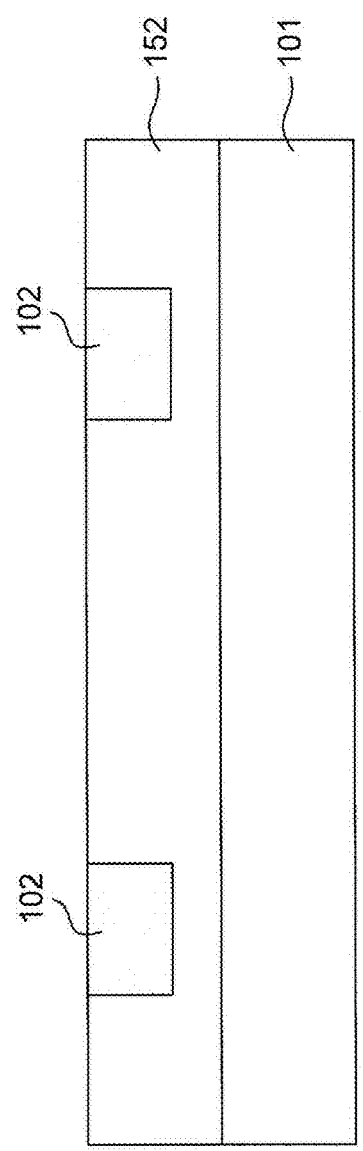
FIGS. 1A to 1N are cross sectional views of fabricating an example semiconductor structure utilizing a photoresist de-cross link process, according to some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper", "over", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the below disclosure.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "FinFET" refers to a FET that is formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The present disclosure provides exemplary methods for forming semiconductor structures with a photoresist cross link process and a photoresist de-cross link process. In forming opening areas (e.g., trenches and vias) in semiconductor structures, a directional etching process (e.g., a dry plasma etch) can generate carbon-based defects during the etching of a photoresist. Without proper treatment, these defects can become too thick to be removed in a subsequent cleaning step. If not removed, these defects can cause device failures or create device reliability issues. The present disclosure describes a photoresist cross link process and a photoresist de-cross link process to reduce the defects formed during the etching process.

Figure 1B:
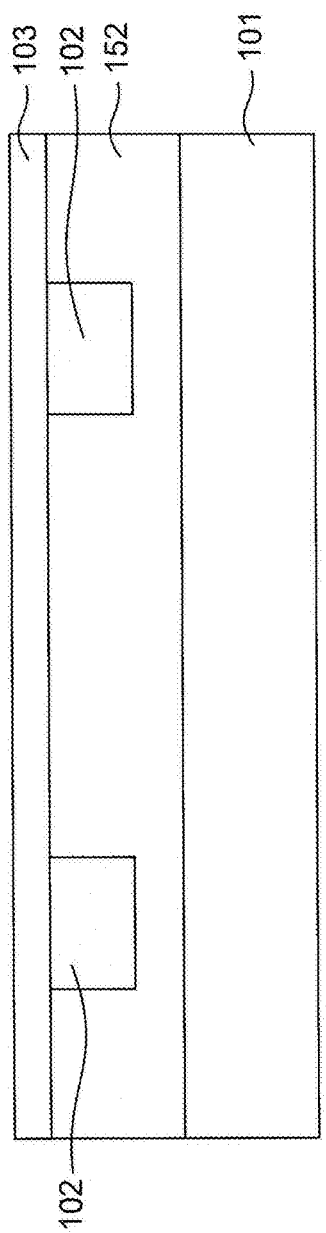
Figure 1C:
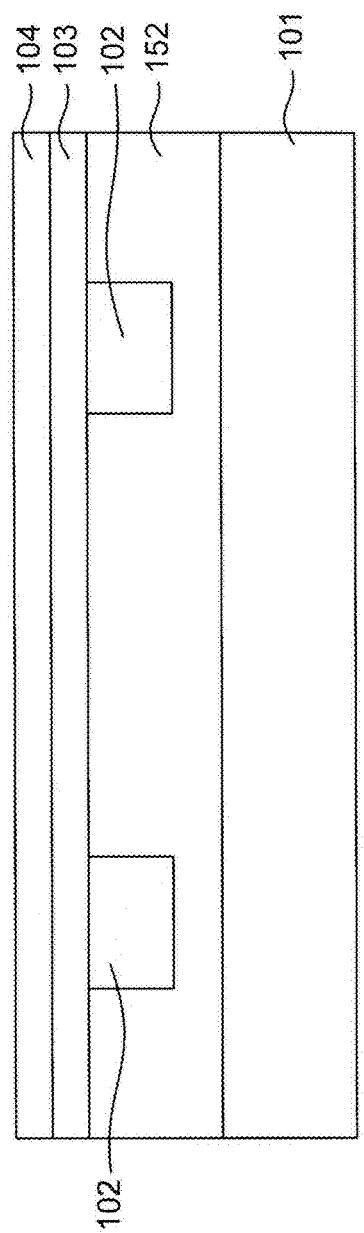
Figure 1D:
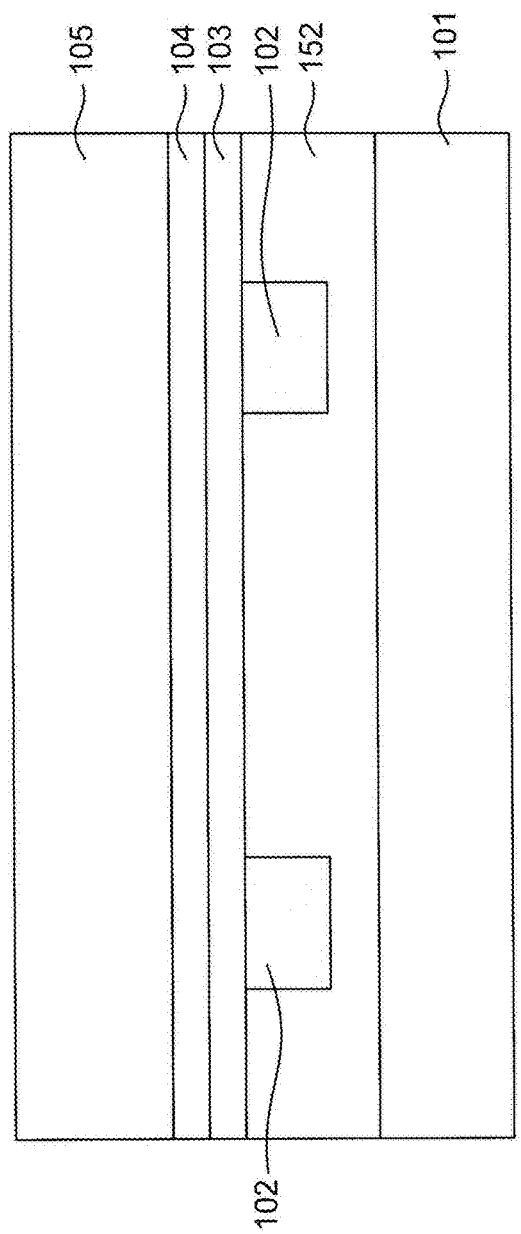
Figure 1E:
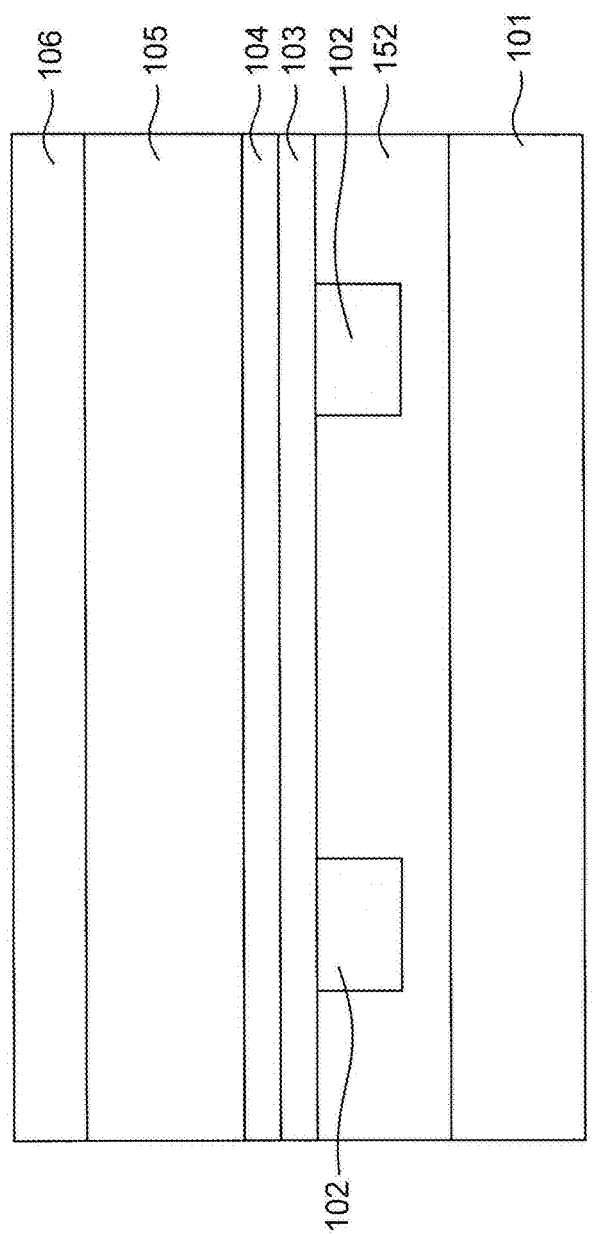
Figure 1F:
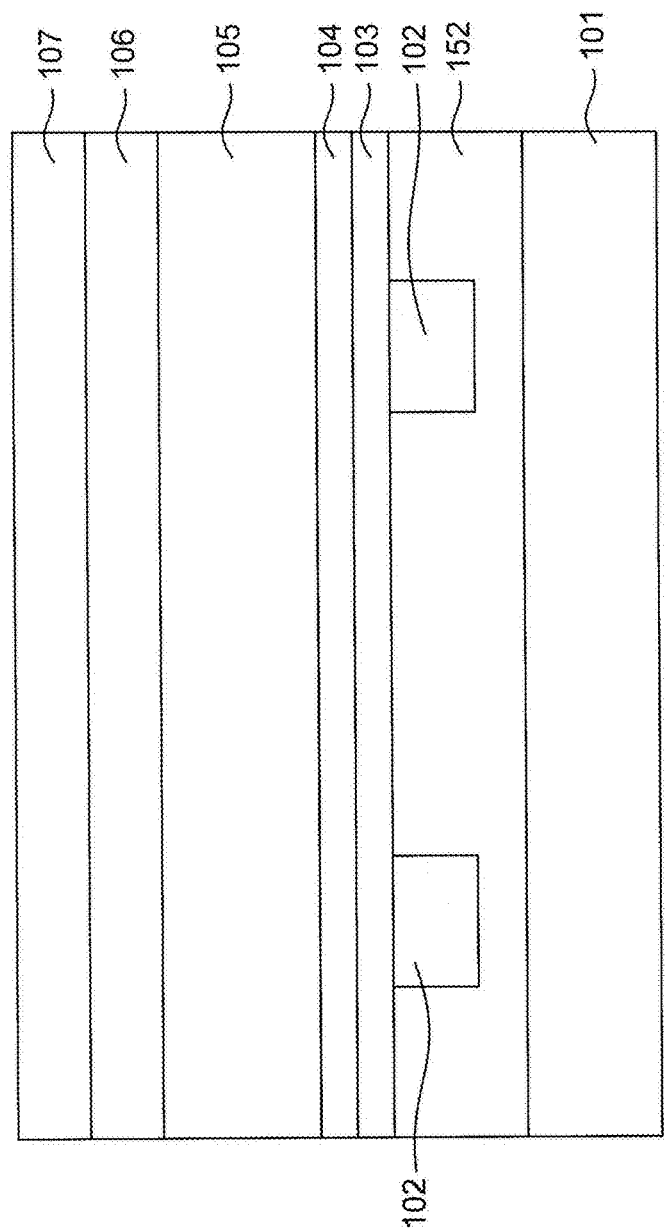
Figure 1G:
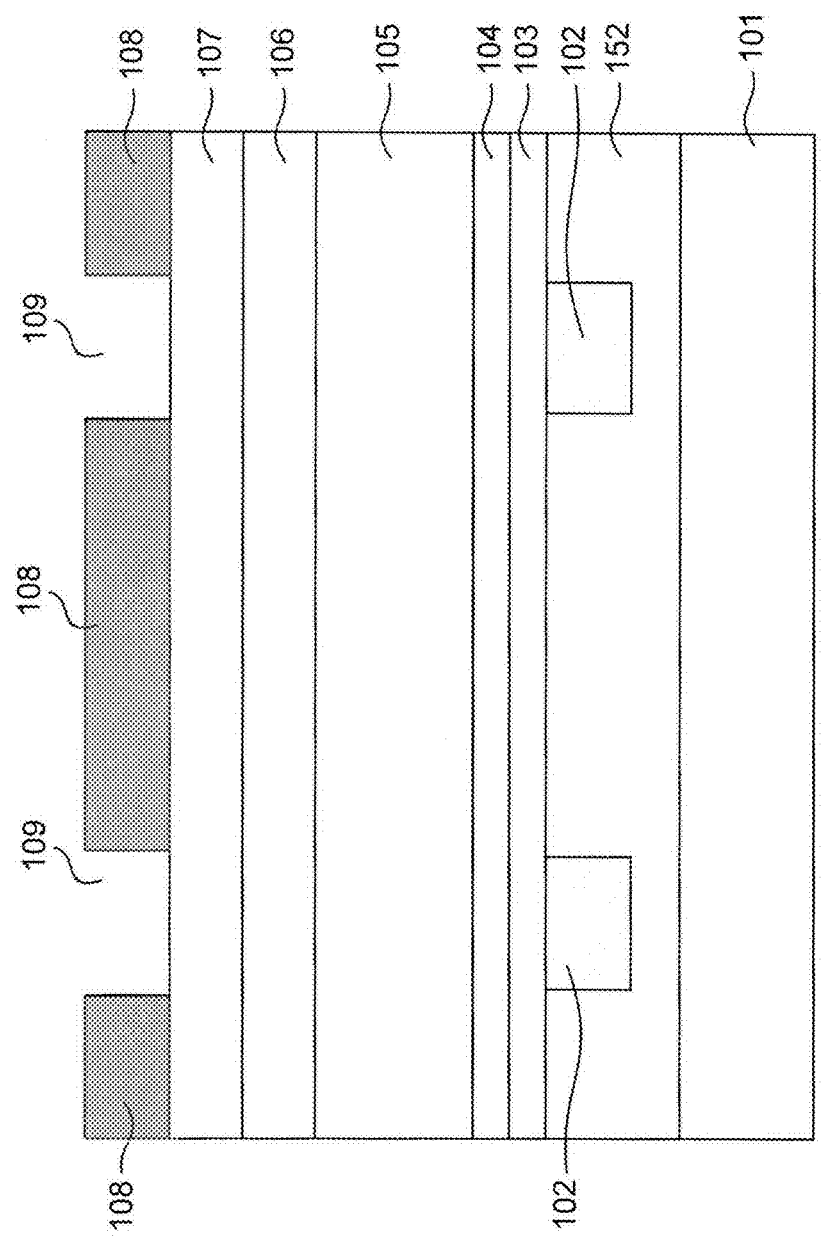
Figure 1H:
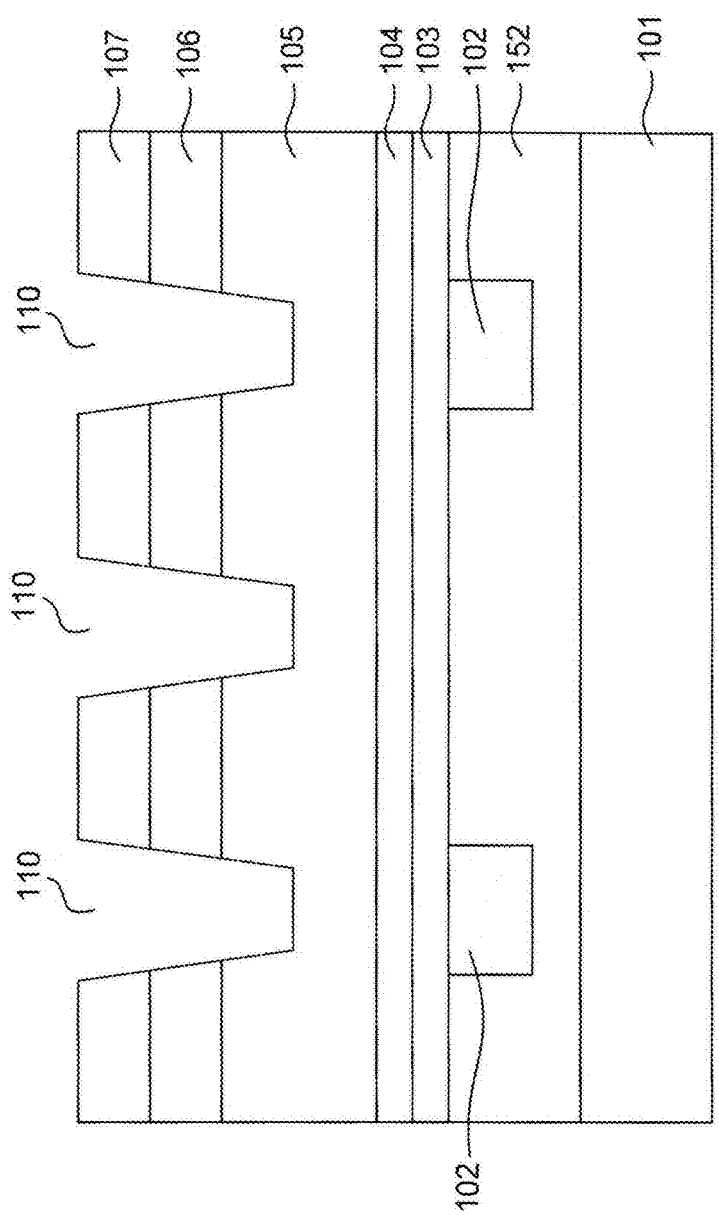
Figure 1I:
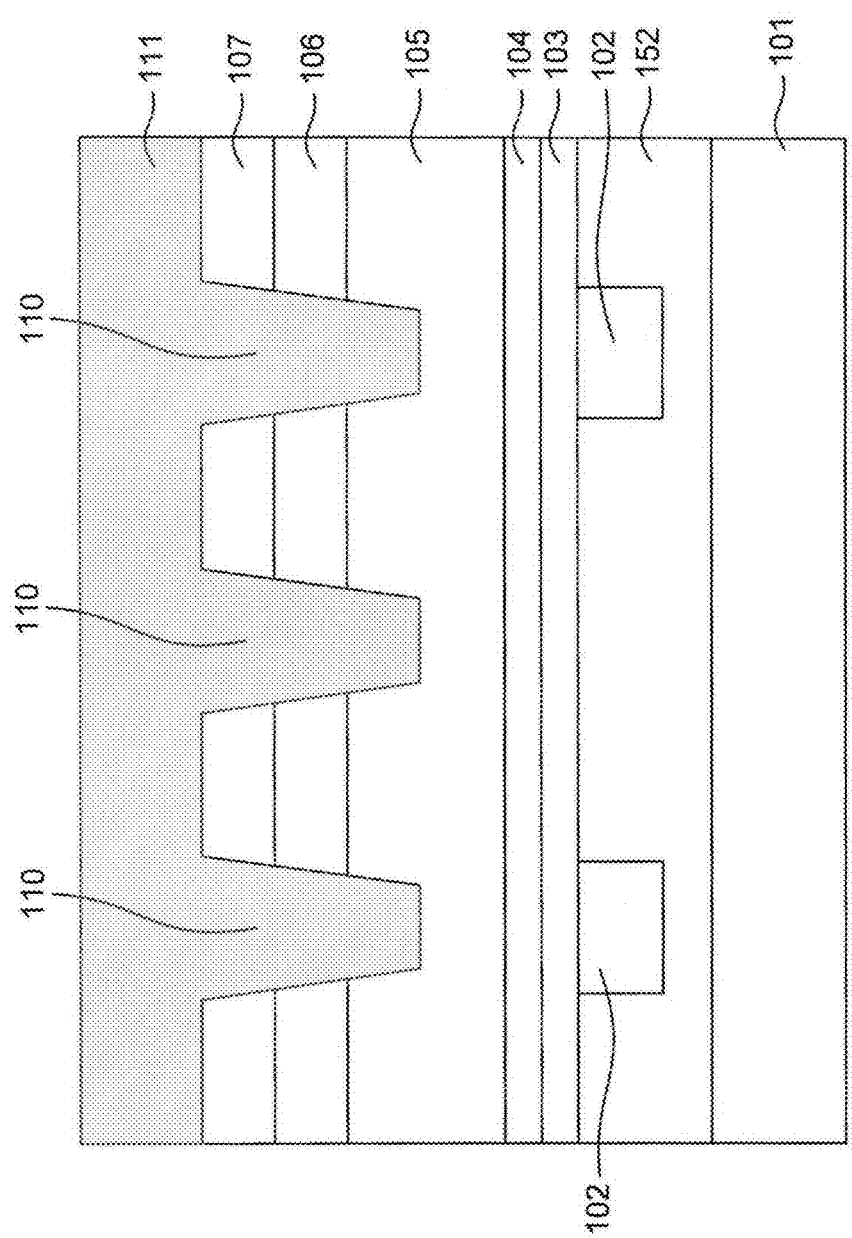
Figure 1J:
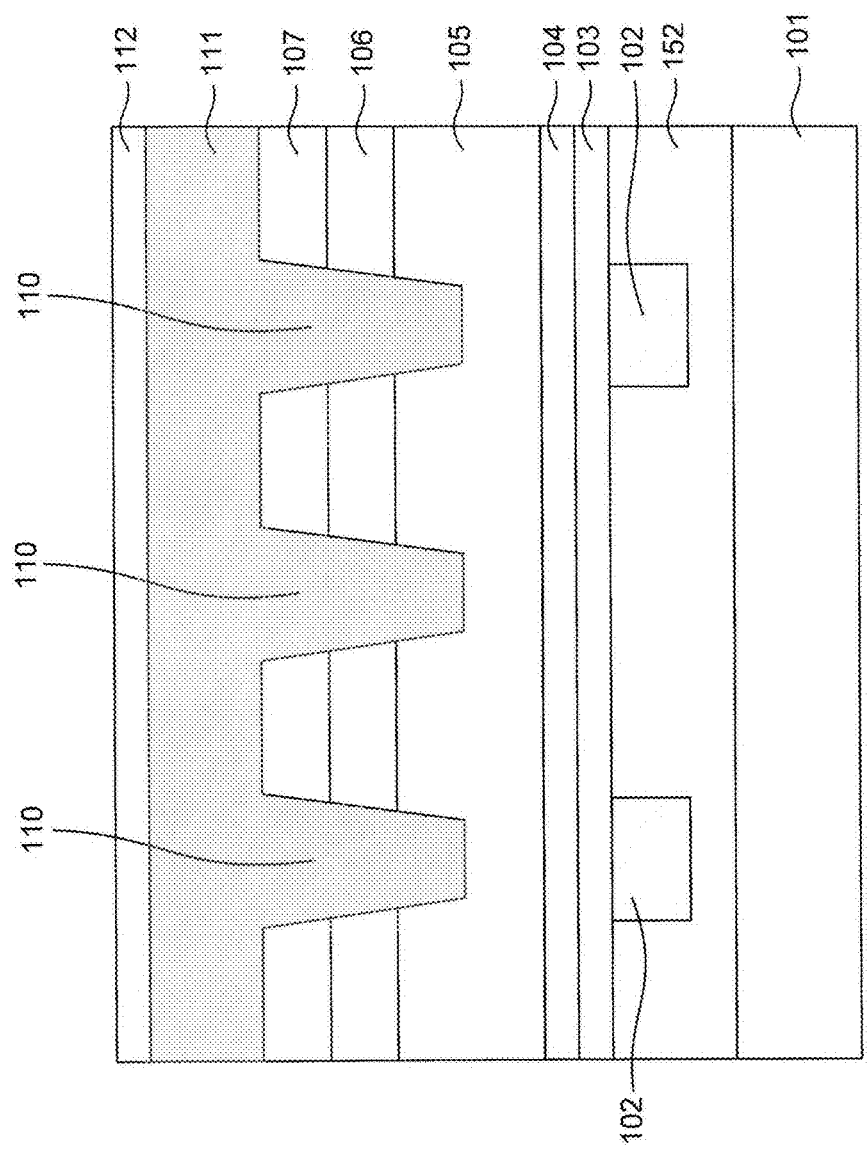
Figure 1K:
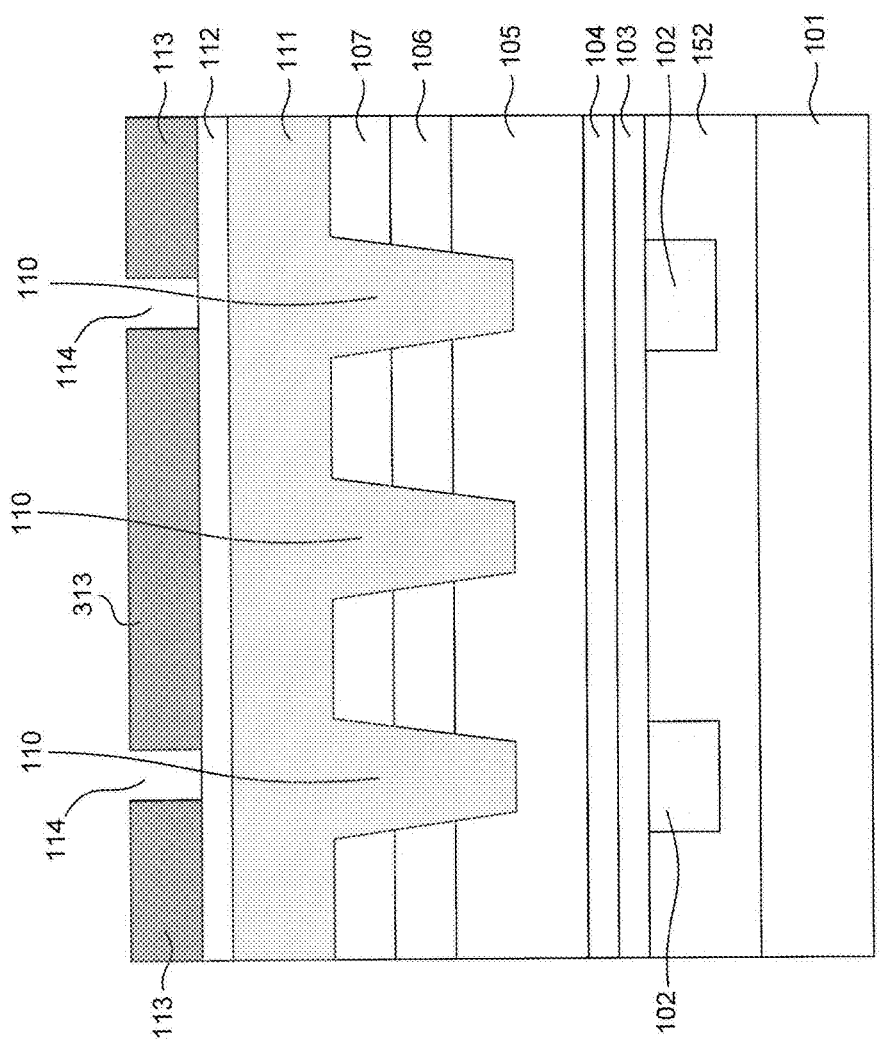
Figure 1L:
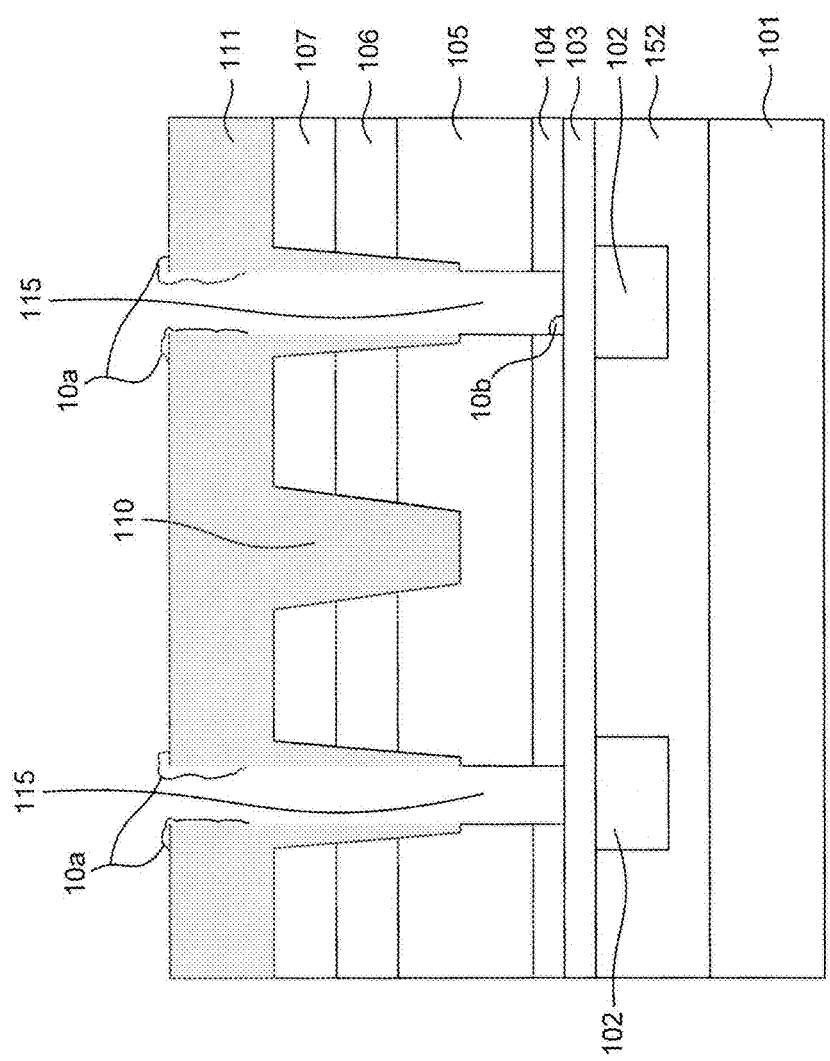
Figure 1M:
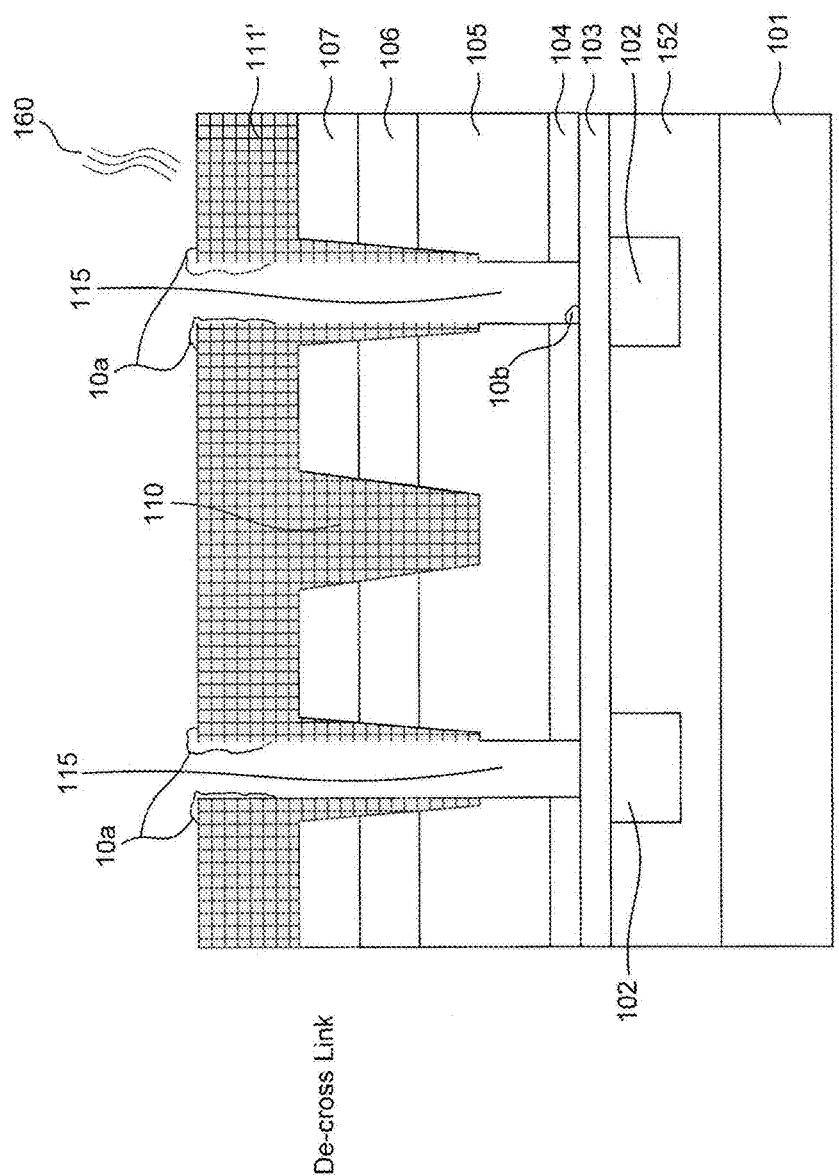
Figure 1N:
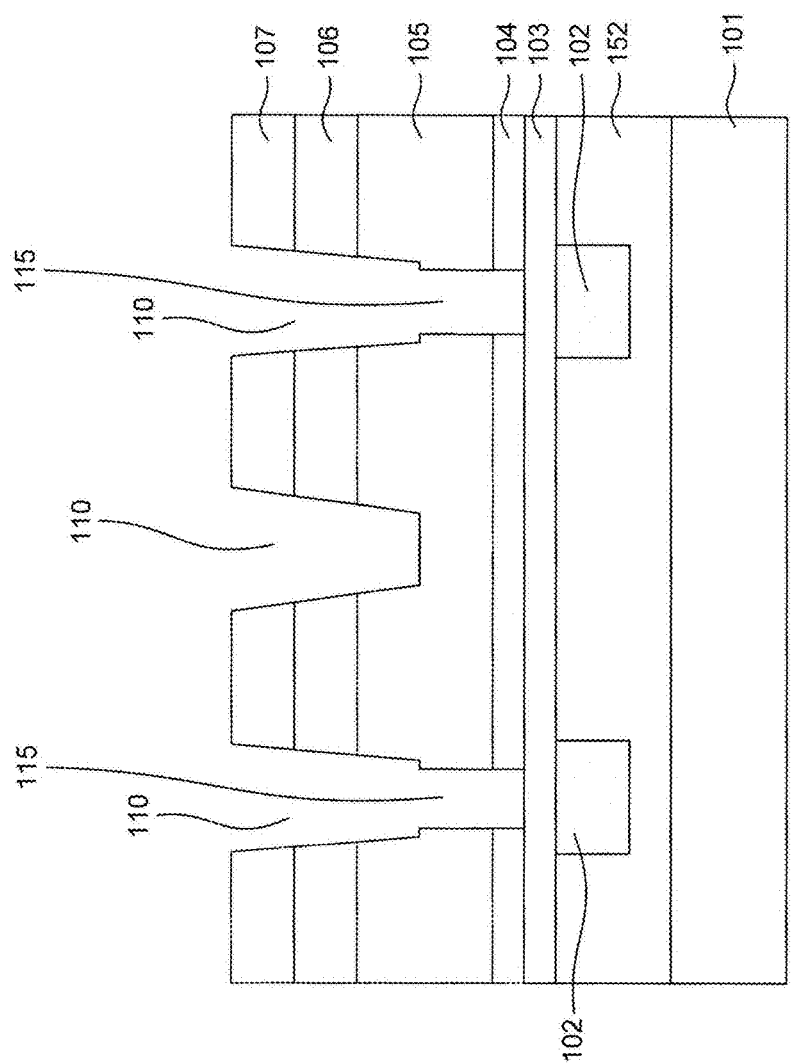
Figure 2:
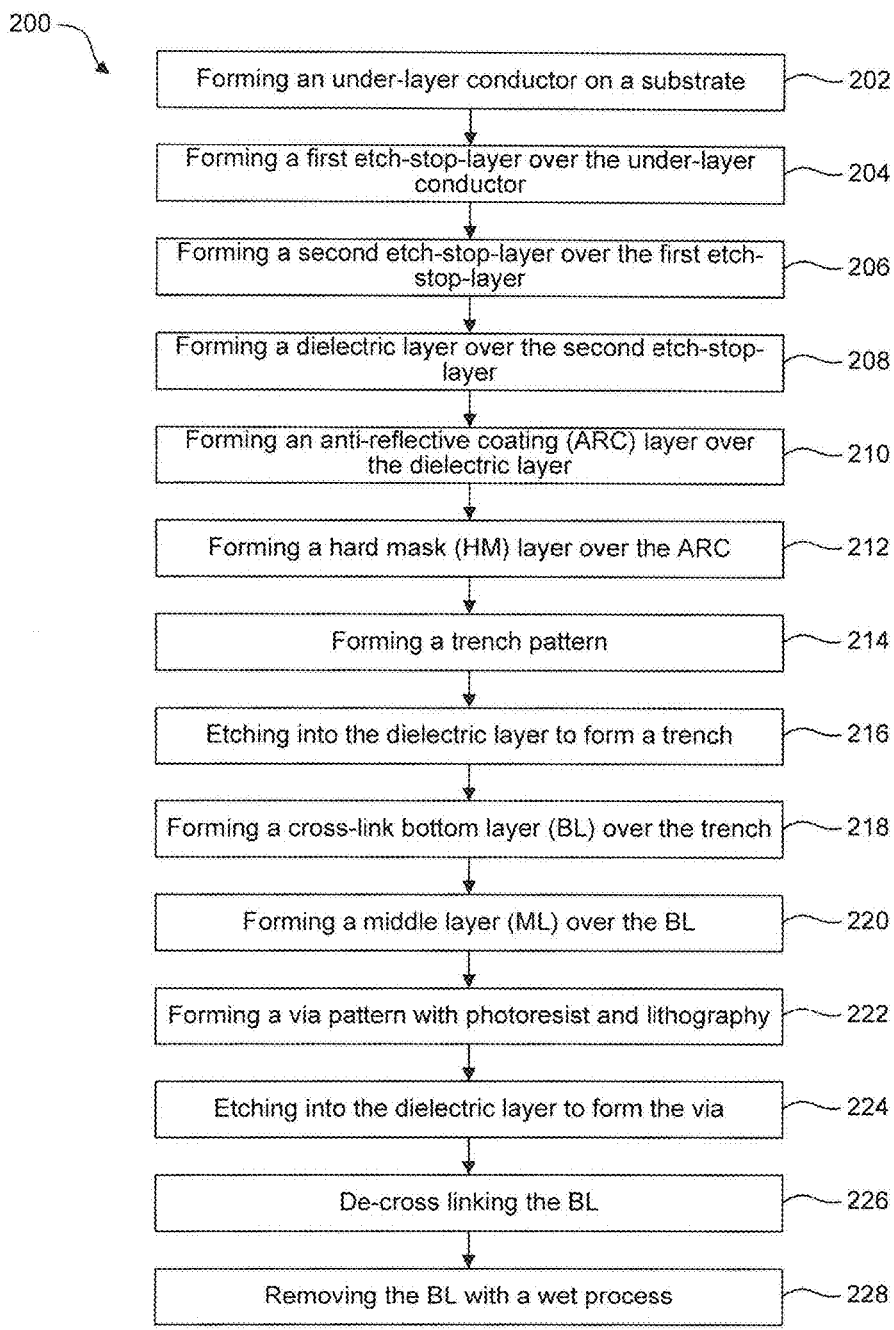
FIG. 2 is a flow diagram illustrating an example method for fabricating a semiconductor structure incorporating a photoresist de-cross link process, according to some embodiments.

FIGS. 1A to 1N are cross sectional views of fabricating an example semiconductor structure utilizing a photoresist de-cross link process, according to some embodiments. FIG. 2 is a flow diagram illustrating an example method 200 for fabricating a semiconductor structure incorporating a photoresist de-cross link process, according to some embodiments. FIGS. 1A to 1N are provided as example cross sectional views to facilitate in the explanation of method 200.

Referring to FIG. 2, the method 200 begins at operation 202 by forming an under-layer conductor on a substrate, according to some embodiments. FIG. 1A shows a first dielectric layer 152 and an under-layer conductor 102 formed on a substrate 101. The substrate 101 can be made of silicon or some other suitable elementary semiconductor such as, for example, diamond or germanium (Ge); a suitable compound semiconductor such as, for example, silicon carbide (SiC), indium arsenide (InAs), or indium phosphide (InP); or a suitable alloy semiconductor such as, for example, silicon germanium carbide (SiGeC), gallium arsenic phosphide (GaAsP), or gallium indium phosphide (GaInP). Alternatively, the substrate 101 can include a non-semiconductor material such as a glass for thin-film-transistor liquid crystal display (TFT-LCD) devices. In addition, the substrate 101 can include a semiconductor on insulator (SOI). The substrate 101 can include various doped regions, dielectric features, and multilevel interconnects. In some embodiments, the substrate 101 can include various doped features for various microelectronic components such as, for example, a MOSFET, a FinFET, an imaging sensor, a memory cell, and/or a capacitive element. In some embodiments, the substrate 101 can include conductive material features and dielectric material features configured for coupling and isolating various microelectronic components, respectively. In some embodiments, the substrate 101 can include one or more material layers formed thereon.

In some embodiments, the first dielectric layer 152 is an interlayer dielectric (ILD) layer formed with a dielectric material such as, for example, silicon oxide (SiOx), silicon nitride (SiNx), or silicon oxynitride (SiON). In some embodiments, the under-layer conductor 102 can be a patterned layer of metal for an interconnect surrounded and insulated by the first dielectric layer 152. This patterned layer of metal can include metals and/or barriers to prevent diffusion of materials from or into the under-layer conductor 102. In some embodiments, the under-layer conductor 102 can be a patterned layer of conducting area formed on silicon (Si) such as, for example, implanted source or drain areas for a field-effect-transistor (FET) device.

Referring to FIG. 2, the method 200 proceeds to operation 204 by forming a first etch-stop layer over the under-layer conductor. FIG. 1B shows a first etch-stop layer formed over the under-layer conductor 102. In some embodiments, the first etch-stop layer 103 can be a carbon containing silicon oxide (SiOC), silicon oxide (SiOx), tetraethyl orthosilicate (TEOS), aluminum oxide (AlO$_x$), suitable high-k dielectrics, or metal containing materials. In some embodiments, the first etch-stop layer 103 can be formed by a suitable process such as, for example, a chemical vapor deposition (CVD) process, a plasma enhanced chemical vapor deposition (PECVD) process, an atomic layer deposition (ALD) process, a spin-on process, or a physical vapor deposition (PVD) process. In some embodiments, the first etch-stop layer 103 has a thickness between 10 Å and 50 Å. In some embodiments, the first etch-stop layer 103 can serve as a stop layer for a subsequent etch process due to its low etch rate in the etch process.

The method 200 proceeds to operation 206 by forming a second etch-stop layer over the first etch-stop layer. FIG. 1C shows a second etch-stop layer 104 over the first etch-stop layer 103. In some embodiments, the second etch-stop layer 104 can be a silicon oxide or a carbon containing silicon oxide (SiOC). In some embodiments, the second etch-stop layer 104 can be formed by a suitable process such as, for example, a CVD process, a PECVD process, an ALD process, a spin-on process, or a PVD process. In some embodiments, the second etch-stop layer 104 has a thickness between 10 Å and 100 Å. In some embodiments, the second etch-stop layer 104 can serve as a soft landing layer for a subsequent etch process because it has a higher etch rate in the etch process than the first etch-stop layer. In some embodiments, the second etch-stop layer 104 can serve as an adhesion layer to improve an adhesion between the structure above it and the first etch-stop layer 103.

The method 200 proceeds to operation 208 by forming a dielectric layer over the second etch-stop layer. FIG. 1D shows a second dielectric layer 105 formed over the second etch-stop layer 104. In some embodiments, the second dielectric layer 105 is a low-k material that has a dielectric constant (k-value) less than 3.9. In some embodiments, the second dielectric layer 105 is an extremely low-k (ELK) material that has a k-value less than 3.5. In some embodiments, the dielectric layer includes, for example, silicon oxide (SiO$_x$), silicon oxide doped with fluorine (SiOF), silicon oxide doped with carbon (SiOC), silicon oxide doped with hydrogen, polymers, and highly porous oxides. In some embodiments, the second etch-stop layer 104 can be formed by a suitable process such as, for example, a CVD process, a PECVD process, an ALD process, a spin-on process, or a PVD process. In some embodiments, the second dielectric layer 105 has a thickness between 300 Å and 1000 Å. In some embodiments, the second dielectric layer 105 serves as an interlayer dielectric layer (ILD). Interconnect structures such as vias and trenches can be formed within the second dielectric layer 105.

The method 200 proceeds to operation 210 by forming an anti-reflective coating (ARC) layer over the dielectric layer. FIG. 1E shows an anti-reflective coating (ARC) layer 106 formed over the second dielectric layer 105. In some embodiments, the ARC layer 106 serves as a reflection reduction layer to reduce reflection during lithography exposing processes. In some embodiments, the ARC layer 106 can include a top anti-reflective coating (TARC) layer and a bottom anti-reflective coating (BARC) layer. In some embodiments, the ARC layer 106 can include silicon oxide (SiO$_x$), silicon nitride (SiN$_x$), metal containing oxides, and metal containing nitrides. In some embodiments, the thickness of the ARC layer 106 is between 100 Å and 300 Å. In some embodiments, the ARC layer 106 is formed by a suitable process such as, for example, a CVD process, a PECVD process, an ALD process, a spin-on process, and a PVD process.

The method 200 proceeds to operation 212 by forming a hard mask layer over the ARC layer. FIG. 1F shows a hard mask layer 107 formed over the ARC layer 106. In some embodiments, the hard mask layer 107 can be a nitride layer or a carbide layer. In some embodiments, the hard mask layer 107 can be a titanium nitride (TiN) layer. In some embodiments, the hard mask layer 107 is formed by a suitable process such as, for example, a CVD process, an ALD process, and a PVD process. In some embodiments, the hard mask layer 107 has a thickness between 200 Å and 350 Å. In some embodiments, the hard mask layer 107 serves as a masking layer for a subsequent etching process due to its low etch rate in the etching process.

The method 200 proceeds to operation 214 by forming a trench pattern over the hard mask layer. FIG. 1G shows a trench pattern formed over the hard mask layer 107. In some embodiments, the trench pattern includes openings 109 formed in a layer of photoresist 108 via lithography. Forming the trench pattern includes a number of process steps such as, for example, spin coating the photoresist 108, soft baking the photoresist 108, exposing of the photoresist 108 in photolithography using a mask that contains the trench pattern to be formed, baking the photoresist 108 post exposure, and developing the photoresist 108. In some embodiments, the photoresist 108 is a positive tone resist. In some embodiments, the photoresist 108 has a thickness between 200 Å and 1000 Å.

The method 200 proceeds to operation 216 by etching into the dielectric layer through the openings and forming trenches. FIG. 1H shows the formation of trenches 110 that result from the etching of the second dielectric layer 105 through the openings 109. In some embodiments, the etching can be performed by using different chemistries including, such as, fluorohydrocarbons (CxHyFz), chlorine (Cl2), hydrogen bromide (HBr), sulfur hexafluoride (SF6), oxygen (O2), nitrogen (N2), argon (Ar), or combinations thereof. In some embodiments, the etching process is a timed process or a process with end-point control. A wet strip process can be employed to remove the residual photoresist 108 before or after the etching process. In some embodiments, in addition to a wet strip process, additional cleaning step can be employed to remove the by-products and/or the defects produced during the lithography and etching processes. In some embodiments, referring to FIG. 1H, the bottom of the trench 110 is within the second dielectric layer 105.

The method 200 proceeds to operation 218 by forming a cross link bottom layer (BL) over the trench. FIG. 1I shows a cross-link BL 111 over the trench 110. In some embodiments, the cross link BL 111 fills the trench 110. In some embodiments, the cross link BL 111 includes methacrylate-based polymers with cross linked chains between the polymers. In some embodiments, the cross link BL 111 has a thickness between 500 Å and 3000 Å (e.g., about 2000 Å).

In some embodiments, forming the cross link BL includes two steps: (i) depositing a non-cross link BL and (ii) cross linking the non-cross link BL. In some embodiments, the non-cross link BL includes methacrylate-based polymers with little to no cross linked chains between the polymers. In some embodiments, the methacrylate-based polymers in the non-cross link BL includes a methacrylate-based main chain. In some embodiments, the methacrylate-based polymers in the non-cross link BL includes a benzene-based side chain. In some embodiments, depositing the non-cross link BL is performed by a suitable process such as, for example, a spin coating process, a CVD process, a PECVD process, or an ALD process. The spin coating process spin coats an aqueous mixture of a cross linking reagent and a solvent over the trench 110 to fill the trench 110. In some embodiments, the cross linking reagent includes a methacrylate-based cross linking polymer. The solvent includes propylene glycol monomethyl ether (PGME) or propylene glycol monomethyl ether acetate (PGMEA). In some embodiments, the second step of cross linking the non-cross link BL is performed by a suitable process such as, for example, a cross link bake. In some embodiments, the cross link bake is performed at a temperature below 350° C. In some embodiments, the cross link bake is performed at a temperature between 75° C. and 350° C. In some embodiments, the cross link bake is performed for a time period of less than 180 s.

In some embodiments, the cross linking process includes cross linking the polymer chains between the cross linking reagents in the non-cross link BL. In some embodiments, the cross linking between the cross linking reagents causes the methacrylate-based main chains of the cross linking polymers to cross link. In some embodiments, the energy needed by the cross linking process is provided by the cross link bake.

Referring to FIG. 2, the method 200 proceeds to operation 220 by forming a middle layer (ML) over the bottom layer (BL). FIG. 1J shows a ML 112 formed over the BL 111. In some embodiments, the ML 112 includes a spin-on oxide (SOG). In some embodiments, the ML 112 has a thickness between 100 Å and 350 Å. In some embodiments, the ML 112 is formed by a suitable process such as, for example, a spin-on process. In some embodiments, the spin-on process uses a solvent-based spin-on oxide and the solvent includes PGME or PGMEA. In some embodiments, the spin-on process further includes a solvent bake step to bake out the solvents in the spin-on oxide that forms the ML. In some embodiments, the solvent bake step is performed at a temperature less than 350° C. In some embodiments, the solvent bake is performed at a temperature between 75° C. and 350° C. In some embodiments, the solvent bake is performed at a temperature between 250° C. and 350° C. In some embodiments, the solvent bake is performed for a time period between 60 s and 180 s. In some embodiments, the ML 112 serves to define the critical dimension (CD) of the feature (e.g., a via) to be formed in a subsequent etching step.

The method 200 proceeds to operation 222 by forming a via pattern over the ML. FIG. 1K shows a via pattern formed over the ML 112. In some embodiments, the via pattern includes openings 114 formed in a layer of photoresist 113 via lithography. Forming the via pattern includes a number of process steps such as, for example, spin coating the photoresist 113, soft baking the photoresist 113, exposing of the photoresist 113 in photolithography using a mask that contains the via pattern to be formed, baking the photoresist 113 post exposure, and developing the photoresist 113. In some embodiments, the photoresist 113 is a positive tone resist. In some embodiments, the photoresist 113 has a thickness between 200 Å and 1000 Å.

The method 200 proceeds to operation 224 by etching into the dielectric layer to form a via through the openings defined at operation 222. FIG. 1L shows the second dielectric layer 105 etched to form a via 115 through the opening 114. In some embodiments, the etching includes a dry etch process. In some embodiments, the etching can be performed by using different chemistries such as, for example, carbon tetrafluoride (CF4), diazene (N2H2), carbon dioxide (CO2), fluorohydrocarbons (CxHyFz), chlorine (Cl2), hydrogen bromide (HBr), sulfur hexafluoride (SF6), oxygen (O2), nitrogen (N2), argon (Ar), or combinations thereof. In some embodiments, the etching process employs a plasma with a plasma power between 100 W and 800 W. In some embodiments, the etching process is a timed process or a process with end-point control. In some embodiments, as illustrated in FIG. 1L, the etching process includes a one-step etch that etches through the BL 111, the HM layer 107, the ARC layer 106, the second dielectric layer 105, and the second etch-stop layer 104. The etching process is stopped by the first etch-stop layer 103. In some embodiments, the etching process to form the via 115 further includes an additional etch step that etches through the first etch-stop layer 103 to connect the via 115 with the under-layer conductor 102 (not shown in FIG. 1L). In some embodiments, the additional etch step that etches through the first etch-stop layer 103 is performed by a suitable process such as, for example, a dry etch process or a wet etch process. A wet strip process can be employed to remove the residual photoresist 113 before or after the etching process. In some embodiments, in addition to a wet strip process, an additional cleaning step can be employed to remove the by-products and/or the defects produced during the lithography and etching processes.

In some embodiments, defects are formed during the etching process. In some embodiments, the defects are carbon-based by-products generated during the etching of the photoresist 113, the etching of the ML 112, the etching of the BL 111, the etching of the second dielectric layer 105, and/or the etching of the second etch-stop layer 104. In some embodiments, the defects are formed towards the top of the etched profile, as illustrated by 10a in FIG. 1L. In some embodiments, the defects are formed towards the bottom of the etched profile, as illustrated by 10b in FIG. 1L.

A benefit of using cross link BL 111 during the operation 224 is that the amount of defects 10a and 10b are removed or reduced during the etching of the BL 111. A non-cross link BL can have little to no cross linked chains between the polymers in the BL. The polymers with little or no cross linked chains are prone to generate carbon-based defects during the etching of the BL. In some embodiments, the etching of a non-cross link BL can generate defects with thicknesses greater than, for example, 50 Å. Such thick defects can be difficult to remove by subsequent cleaning processes and can cause failures or reliability issues in the device. In comparison, the cross link BL 111 is less prone to generate thick defects due to the strongly bonded and heavily cross linked polymers in the cross link BL 111. In some embodiments, the etching of the cross link BL 111 generates defects with thicknesses less than, for example, 30 Å. Defects with these thicknesses are more likely to be removed by subsequent cleaning processes.

The method 200 proceeds to operation 226 by de-cross linking the BL to form a de-cross link BL. FIG. 1M shows a de-cross link process 160 performed on the BL 111 to form a de-cross link BL 111'. In some embodiments, the de-cross link process 160 includes breaking or opening the cross linked polymer chains formed at operation 218 in the cross link BL 111. In some embodiments, the de-cross link process 160 includes a de-cross link vacuum ultraviolet (VUV) radiation. In some embodiments, the de-cross link VUV radiation provides the energy to break the polymer chains. In some embodiments, the de-cross link VUV radiation has a wavelength between 172 nm and 283 nm. This wavelength is chosen because a lower wavelength UV radiation with higher energy can cause damage to the second dielectric layer 105 below the BL 111, and a higher wavelength UV radiation with lower energy would have a low efficiency to fully de-cross link the BL 111. In some embodiments, other UV radiations with the wavelength between 172 nm and 283 nm can also be used. In some embodiments, the de-cross link VUV radiation can be a single wavelength, a multi wavelength, or a broadband wavelength. In some embodiments, the de-cross link VUV radiation has an energy of less than 800 mJ. In some embodiments, the de-cross link VUV radiation has an energy between 100 mJ and 800 mJ. In some embodiments, the de-cross link VUV radiation is performed for a time period of less than 180 s. In some embodiments, the de-cross link VUV radiation is performed for a time period between 60 s and 180 s. In some embodiments, the de-cross link VUV radiation is performed in a suitable process tool such as, for example, a clean track on a photolithography tool, a standalone tool, or a combined-in wet clean tool.

In some embodiments, the de-cross link process 160 further includes a de-cross link bake. In some embodiments, the de-cross link bake is performed at a temperature less than 350° C. In some embodiments, the de-cross link bake is performed at a temperature between 75° C. and 350° C. In some embodiments, the de-cross link bake is performed at a temperature between 250° C. and 350° C. In some embodiments, the de-cross link bake is performed for a time period of less than 180 s. In some embodiments, the de-cross link bake is performed for a time period between 60 s and 180 s. In some embodiments, the de-cross link process 160 breaks the cross linked methacrylate-based main chains in the cross link BL 111. As a result, after the de-cross link process 160, the cross link BL 111 changes to a de-cross link BL 111'.

Referring to FIG. 2, the method 200 proceeds to operation 228 by removing the de-cross link BL. FIG. 1N shows removal of the de-cross link BL 111'. In some embodiments, the de-cross link BL 111' is removed with a wet process. In some embodiments, the wet process for removing the de-cross link BL 111' employs solvent-based chemistries that include water. In some embodiments, the water content in the solvent for removing the de-cross link BL 111' is less than 20%. In some embodiments, the solvent can be mixed with hydrogen peroxide ($H_2O_2$). In some embodiments, the solvent includes active components such as, for example, N-methyl-2-pyrrolidone, cyclohexanone, tolunitrile, diethylene glycol, diethylene glycol monobutyl ether, diethylene glycol dimethyl ether, dimethyl sulfoxide, dimethylformamide, poly(ethylene glycol) bis(amine), (2-methylbutyl) amine, tri(2-ethylhexyl)amine, poly(ethylene glycol) methyl ether amine, poly(ethylene glycol) diamine, ammonium fluoride, hydrofluoric acid, potassium fluoride, pyrrolidine, acetone, methyl isobutyl ketone, propylene carbonate, 1-methoxy-2-propanol, dichloromethane, trichloroethylene, 1-chlorobenzotriazole, 5-chlorobenzotriazole, 1-methylimidazole, thiamazole, azole group with functional side chain, and/or $H_2O_2$. In some embodiments, the removal process of the de-cross link BL 111' removes the de-cross link BL 111'. In some embodiments, the removal process of the de-cross link BL 111' does not damage the dielectric layer 104 or the under-layer conductor 102. In some embodiments, the defects are removed along with the removal of the de-cross link BL 111' (e.g., the defects 10a are lifted off during the removal of the de-cross link BL 111'). In some embodiments, an additional dry cleaning and/or wet cleaning process can be employed to remove the defects 10a and 10b. As a result, a clean etch profile of trenches 110 and via 115 as illustrated by FIG. 1N can be achieved.

Figure 3A:
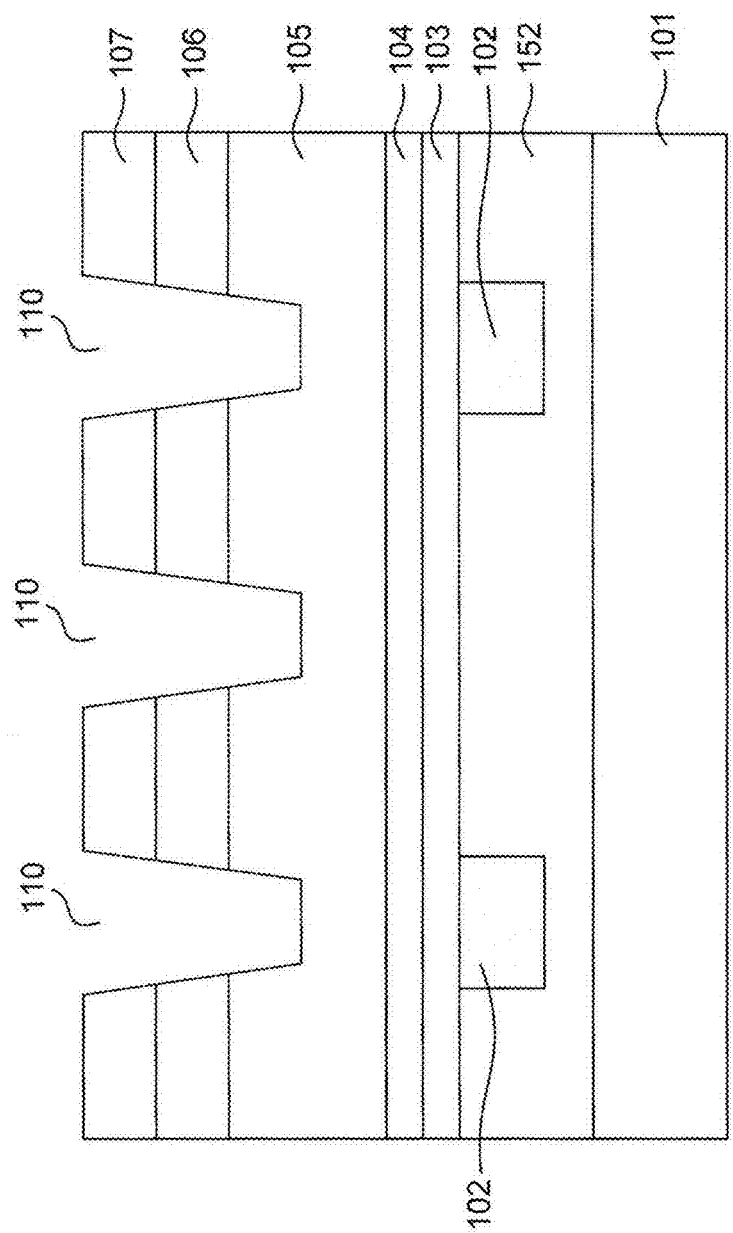
FIGS. 3A to 3G are cross sectional views of fabricating an example semiconductor structure utilizing a photoresist de-cross link process, according to some embodiments.
Figure 3B:
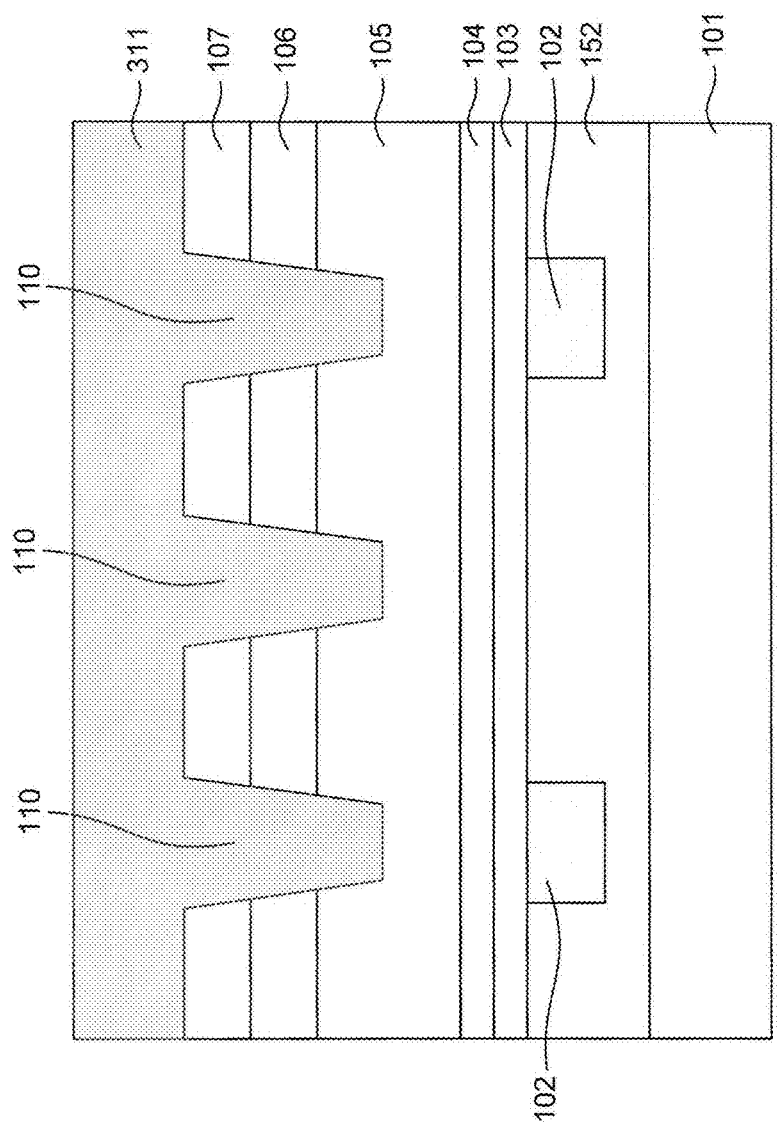
Figure 3C:
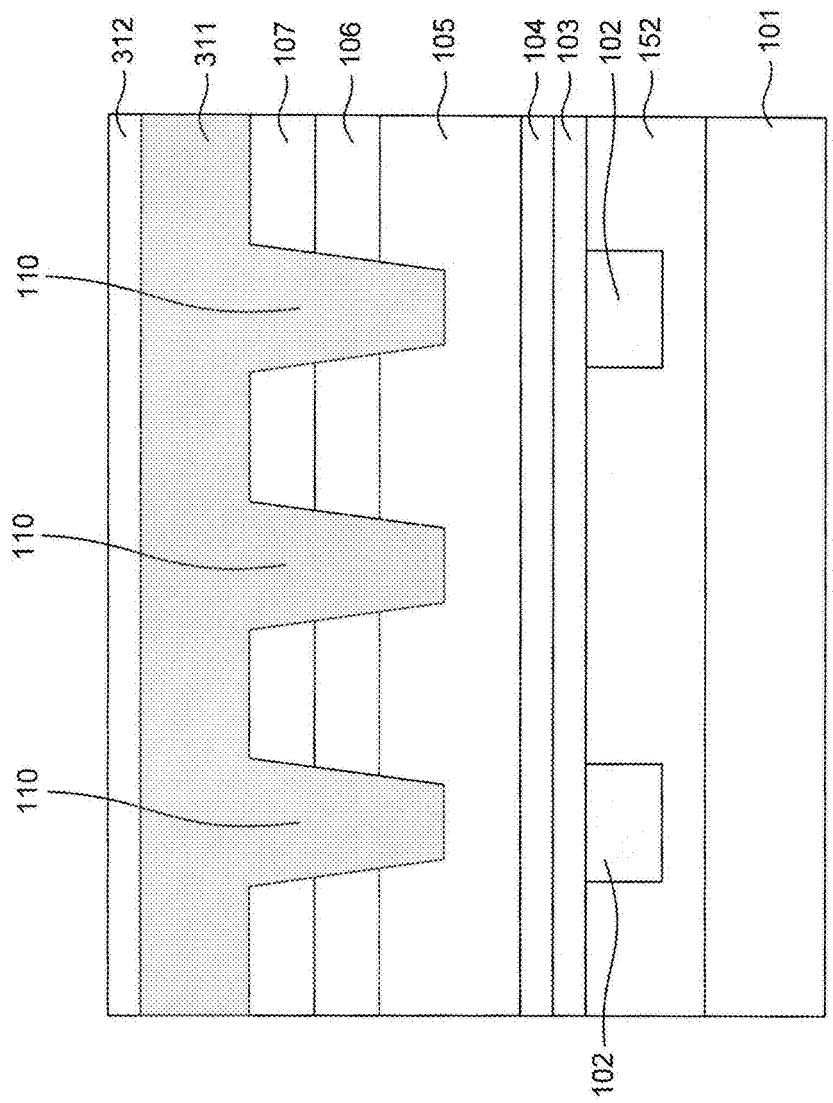
Figure 3D:
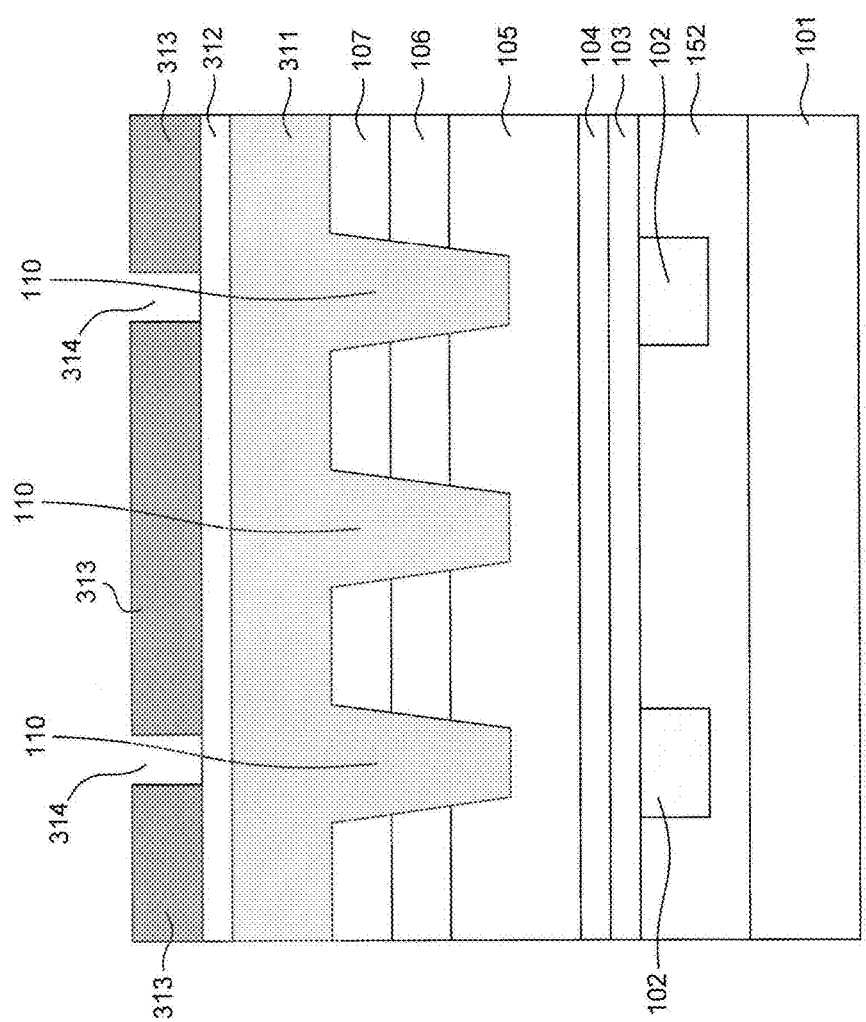
Figure 3E:
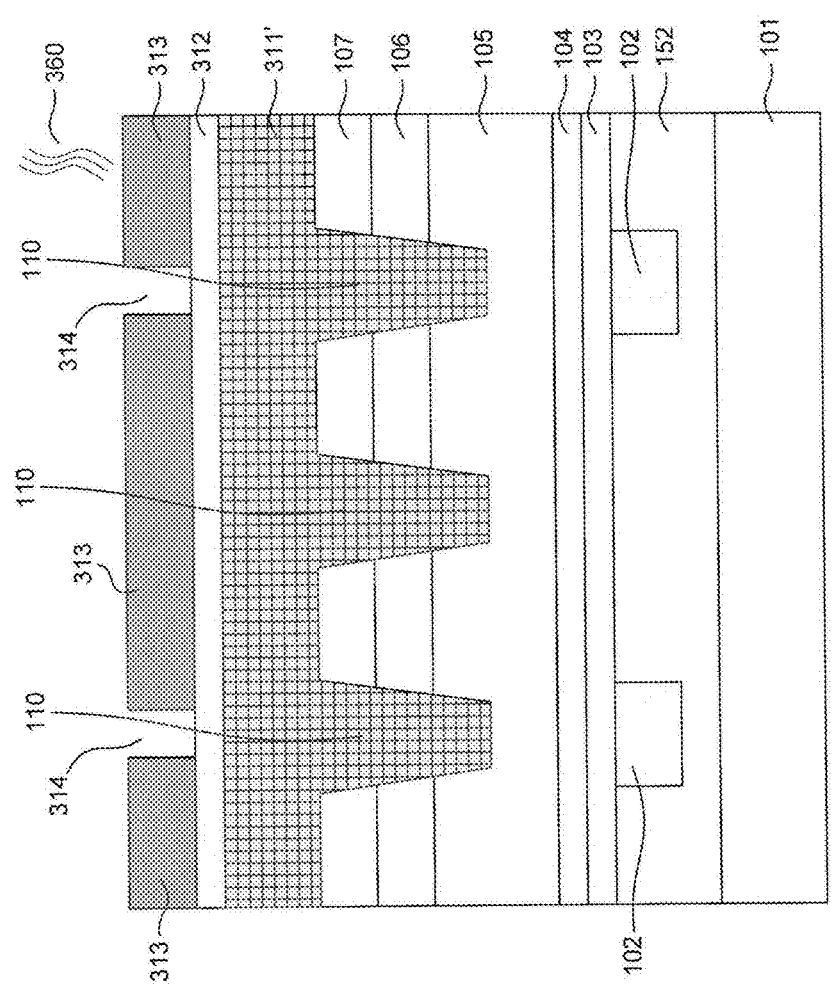
Figure 3F:
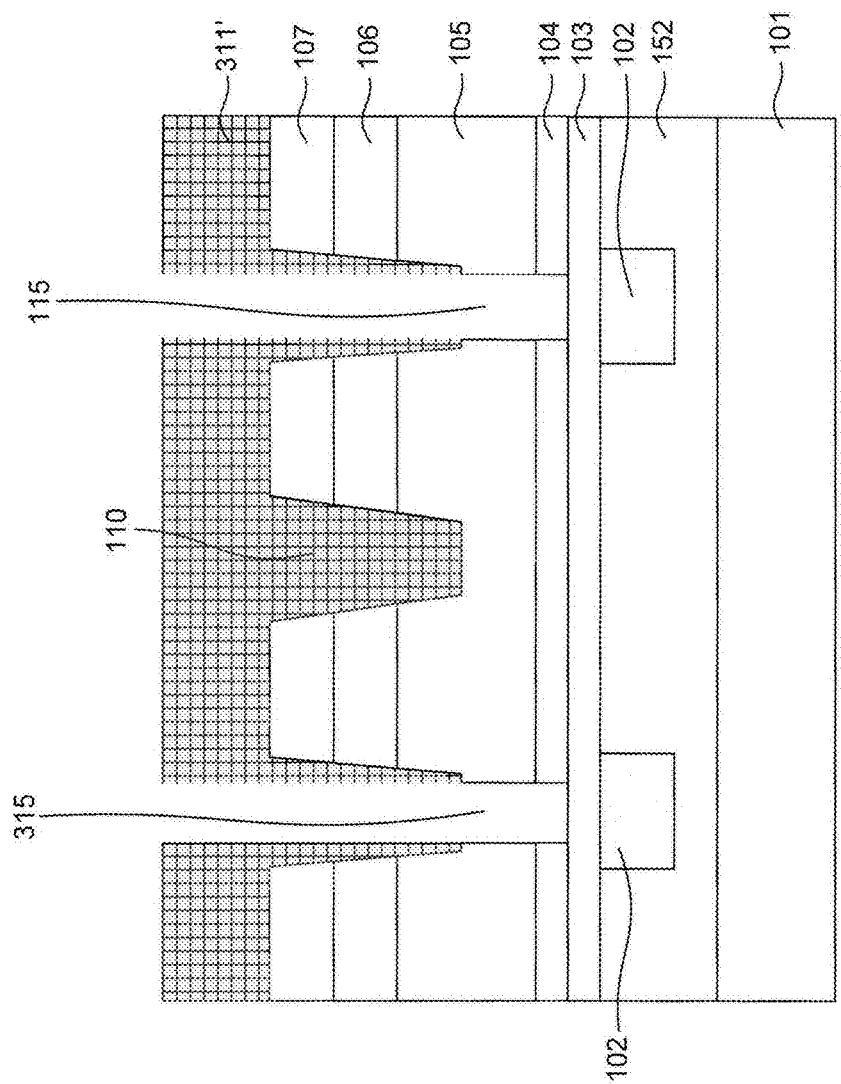
Figure 3G:
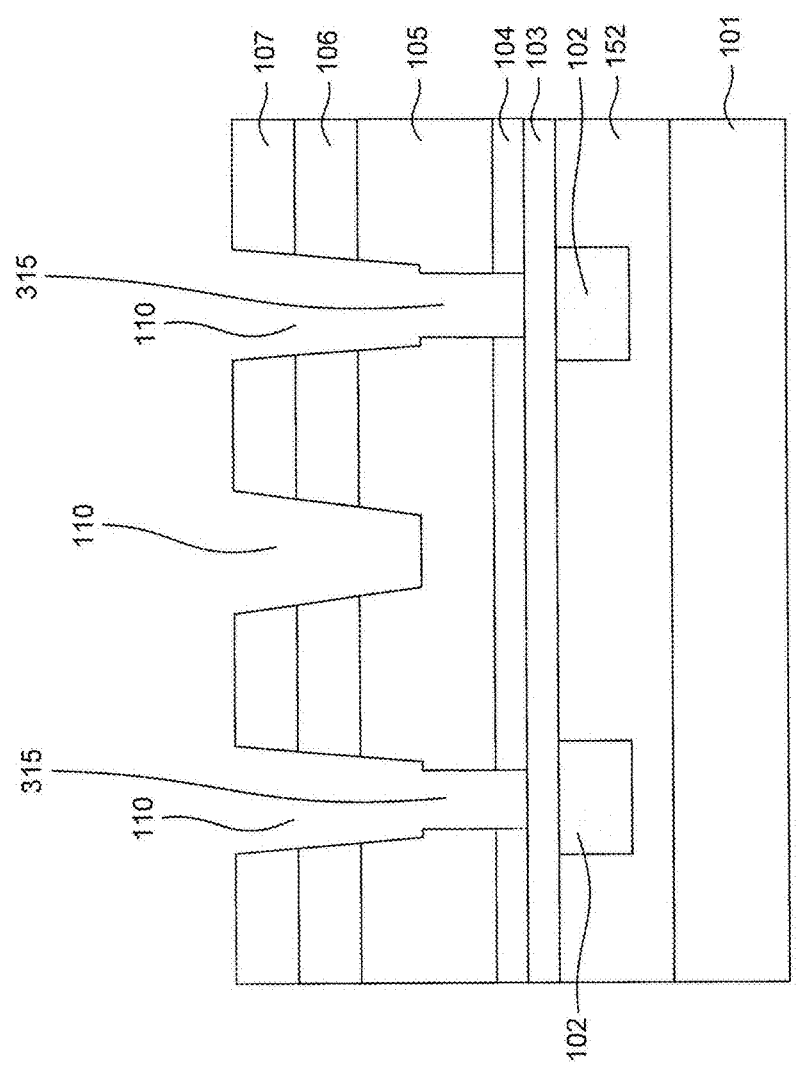
Figure 4:
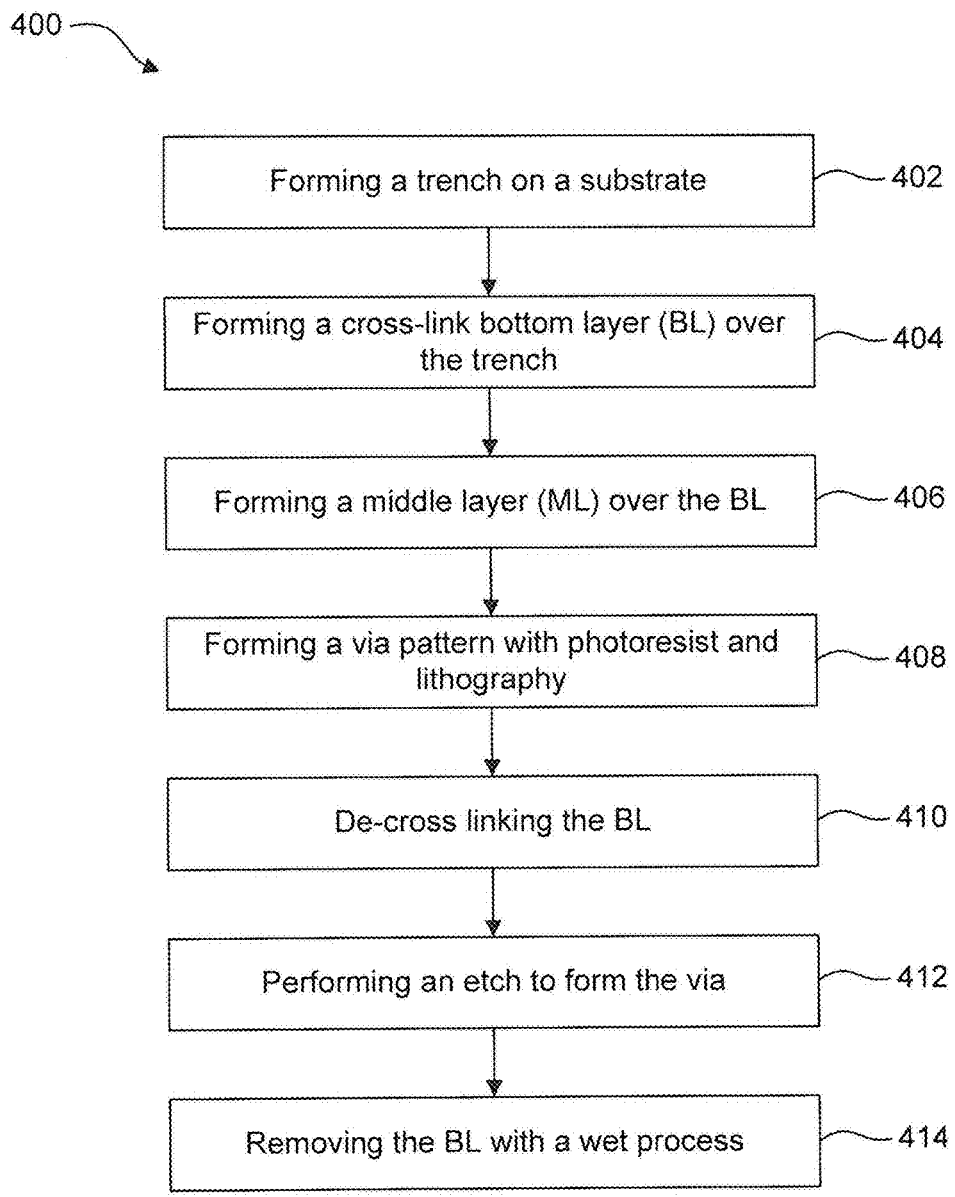
FIG. 4 is a flow diagram illustrating an example method for fabricating a semiconductor structure incorporating a photoresist de-cross link process, according to some embodiments.

FIGS. 3A to 3G are cross sectional views of fabricating an example semiconductor structure utilizing a photoresist de-cross link process, according to some embodiments. FIG. 4 is a flow diagram illustrating an example method 400 for fabricating a semiconductor structure incorporating a photoresist de-cross link process, according to some embodiments. FIGS. 3A to 3G are provided as example cross sectional views to facilitate in the explanation of method 400.

Referring to, the method 400 begins at operation 402 by forming a trench on a substrate. An example method to form the trench on the substrate is described above with respect to operations 202 to 216 of method 200 and respective FIGS. 1A to 1H. FIG. 3A (reproduction of FIG. 1H) shows a trench 110 formed on a substrate 101.

The method 400 proceeds to operation 404 by forming a cross link bottom layer (BL) over the trench. FIG. 3B shows a cross link BL 311 formed over the trench 110. In some embodiments, the cross link BL 311 fills the trench 110. In some embodiments, the cross link BL 311 includes methacrylate-based polymers with cross linked chains between the polymers. In some embodiments, the cross link BL 311 has a thickness between 500 Å and 3000 Å (e.g., about 2000 Å).

In some embodiments, forming the cross link BL 311 includes two steps: (i) depositing a non-cross link BL and (ii) cross linking the non-cross link BL. In some embodiments, the non-cross link BL includes methacrylate-based polymers without cross linked chains between the polymers. In some embodiments, the methacrylate-based polymers in the non-cross link BL includes a methacrylate-based main chain. In some embodiments, the methacrylate-based polymers in the non-cross link BL includes a benzene-based side chain. In some embodiments, depositing the non-cross link BL is performed by a suitable process such as, for example, a spin coating process, a CVD process, a PECVD process, or an ALD process. The spin coating process spin coats an aqueous mixture of a cross linking reagent and a solvent over the trench 110 to fill the trench 110. In some embodiments, the cross linking reagent includes a methacrylate-based cross linking polymer. The solvent includes propylene glycol monomethyl ether (PGME) or propylene glycol monomethyl ether acetate (PGMEA). In some embodiments, the second step of cross linking the non-cross link BL is performed by a suitable process such as, for example, a cross link bake. In some embodiments, the cross link bake is performed at a temperature below 350° C. In some embodiments, the cross link bake is performed at a temperature between 75° C. and 350° C. In some embodiments, the cross link bake is performed at a temperature between 250° C. and 350° C. In some embodiments, the cross link bake is performed for a time period of less than 180 s. In some embodiments, the cross link bake is performed for a time period between 60 s and 180 s.

In some embodiments, the cross linking process involves cross linking the polymer chains between the cross linking reagents in the non-cross link BL. In some embodiments, the cross linking between the cross linking reagents causes the methacrylate-based main chains of the cross linking polymers to cross link. In some embodiments, the energy needed by the cross linking process is provided by the cross link bake.

Referring to FIG. 4, the method 400 proceeds to operation 406 by forming a middle layer (ML) over the cross link bottom layer (BL). FIG. 3C shows an ML 312 formed over the cross link BL 311. In some embodiments, the ML 312 includes a spin-on oxide (SOG). In some embodiments, the ML 312 has a thickness between 100 Å and 350 Å. In some embodiments, the ML 312 is formed by a suitable process such as, for example, a spin-on process. In some embodiments, the spin-on process uses a solvent-based spin-on oxide and the solvent includes PGME or PGMEA. In some embodiments, the spin-on process further includes a solvent bake step to bake out the solvents in the spin-on oxide that forms the ML. In some embodiments, the solvent bake step is performed at a temperature less than 350° C. In some embodiments, the solvent bake is performed at a temperature between 75° C. and 350° C. In some embodiments, the solvent bake is performed at a temperature between 250° C. and 350° C. In some embodiments, the solvent bake is performed for a time period between 60 s and 180 s. In some embodiments, the ML 312 serves to define the critical dimension (CD) of the feature (e.g., a via) to be formed in a subsequent etching step.

The method 400 proceeds to operation 408 by forming a via pattern over the ML. FIG. 3D shows a via pattern 312 formed over the ML 312. In some embodiments, the via pattern includes openings 314 formed in a layer of photoresist 313 via lithography. Forming the via pattern includes a number of process steps such as, for example, spin coating the photoresist 313, soft baking the photoresist 313, exposing of the photoresist 313 in photolithography using a mask that contains the via pattern to be formed, baking the photoresist 313 post exposure, and developing the photoresist 313. In some embodiments, the photoresist 313 is a positive tone resist. In some embodiments, the photoresist 313 has a thickness between 200 Å and 1000 Å.

The method 400 proceeds to operation 410 by de-cross linking the cross link BL 311 to form a de-cross link BL 311'. FIG. 3E shows that a de-cross link process 360 is performed on the BL 311 to form a de-cross link BL 311'. In some embodiments, the de-cross link process 360 includes breaking or opening the cross linked polymer chains formed at operation 404 in the cross link BL 311. In some embodiments, the de-cross link process 306 includes a de-cross link vacuum ultraviolet (VUV) radiation. In some embodiments, the de-cross link VUV radiation provides the energy to break the polymer chains. In some embodiments, the de-cross link VUV radiation has a wavelength between 172 nm and 283 nm. In some embodiments, the de-cross link VUV radiation can be a single wavelength, a multi wavelength, or a broadband wavelength. In some embodiments, the de-cross link VUV radiation has an energy of less than 800 mJ. In some embodiments, the de-cross link VUV radiation has an energy between 100 mJ and 800 mJ. In some embodiments, the de-cross link VUV radiation is performed for a time period of less than 180 s. In some embodiments, the de-cross link VUV radiation is performed for a time period between 60 s and 180 s. In some embodiments, the de-cross link VUV radiation is performed in a suitable process tool such as, for example, a clean track on a photolithography tool, a standalone tool, or a combined-in wet clean tool.

In some embodiments, the de-cross link process 360 further includes a de-cross link bake. In some embodiments, the de-cross link bake is performed at a temperature less than 350° C. In some embodiments, the de-cross link bake is performed at a temperature between 75° C. and 350° C. In some embodiments, the de-cross link bake is performed at a temperature between 250° C. and 350° C. In some embodiments, the de-cross link bake is performed for a time period of less than 180 s. In some embodiments, the de-cross link bake is performed for a time period between 60 s and 180 s. In some embodiments, the de-cross link process 360 breaks the cross linked methacrylate-based main chains in the cross link BL 311. As a result, after the de-cross link process 360, the cross link BL 311 changes to a de-cross link BL 311'.

Referring to FIG. 4, the method 400 proceeds to operation 412 by etching into the dielectric layer to form a via through the openings defined at operation 410. FIG. 3F shows formation of a via 315 through openings 314. In some embodiments, the etching includes a dry etch process. In some embodiments, the etching can be performed by using different chemistries such as, for example, carbon tetrafluoride ($CF_4$), diazene ($N_2H_2$), carbon dioxide ($CO_2$), fluorohydrocarbons ($C_xH_yF_z$), chlorine ($Cl_2$), hydrogen bromide (HBr), sulfur hexafluoride ($SF_6$), oxygen ($O_2$), nitrogen ($N_2$), argon (Ar), or combinations thereof. In some embodiments, the etching process employs a plasma with a plasma power between 100 W and 800 W. In some embodiments, the etching process is a timed process or a process with end-point control. In some embodiments, as illustrated in FIG. 3F, the etching process includes a one-step etch that etches through the de-cross link BL 311', the HM layer 107, the ARC layer 106, the second dielectric layer 105, and the second etch-stop layer 104. The etching process is stopped by the first etch-stop layer 103. In some embodiments, the etching process to form the via 315 further includes an additional etch step that etches through the first etch-stop layer 103 to connect the via 315 with the under-layer conductor 102 (not shown in FIG. 3F). In some embodiments, the additional etch step that etches through the first etch-stop layer 103 is performed by a suitable process such as, for example, a dry etch process or a wet etch process. A wet strip process can be employed to remove the residual photoresist 313 before or after the etching process. In some embodiments, in addition to a wet strip process, additional cleaning step can be employed to remove the by-products and/or the defects produced during the lithography and etching processes.

In some embodiments, more polymer byproducts and carbon-based defects can be generated during the etching of de-cross link BL 311' because the de-cross link BL 311' have more de-cross link polymers with broken or open polymer chains. Similar to a non-cross link BL described previously, the de-cross link BL 311' with loosely linked polymers are more prone to generate thick carbon-based defects during the etching process than the cross linked polymers with stronger bonds in the cross link BL. In some embodiments, the defects generated during the etching of the de-cross link BL 311' include an oxygen containing hydro-carbon (CHO). In some embodiments, the thickness of the defects generated during the etching of the de-cross link BL 311' can be greater than, for example, 50 Å. Such thick defects can be difficult to remove in subsequent cleaning processes and can cause failures or reliability issues to the device. As a result, an additional de-crust process can be implemented to remove the defects generated during the etching of the de-cross link BL 311'.

In some embodiments, the de-crust process is performed during the etching of the de-cross link BL 311' to remove the carbon-based defects generated during the etching of the de-cross link BL 311'. In some embodiments, the de-crust process is incorporated into the etching of the de-cross link BL 311'. The de-crust process can include cycles of etching steps and de-crust steps, in which etching steps use etching gases (e.g., fluorine- or chlorine-based gases) to etch the de-cross link BL 311' and the de-crust steps use de-crust gases (e.g., oxygen-based gases) to remove the carbon-based defects formed during the etching steps. One advantage of incorporating the de-crust process into the etching of the de-cross link BL 311' is that the defects can be removed before the thickness of the defects becomes too thick (e.g., 50 Å), thus becoming more challenging to remove. In some embodiments, the de-crust process is performed after the etching of the de-cross link BL 311' to remove the defects or reduce the thickness of the defects, so that the defects can be removed after subsequent cleaning processes. In some embodiments, the de-crust process is performed by a suitable process such as, for example, a capacitive coupled plasma (CCP) process, an inductive coupled plasma (ICP) process, or a remote plasma process. In some embodiments, the de-crust process can use different chemistries such as, for example, oxygen ($O_2$), carbon dioxide ($CO_2$), nitrogen and hydrogen mixture ($N_2/H_2$), helium and hydrogen mixture ($He/H_2$), and/or argon (Ar). In some embodiments, the de-crust process is performed with a plasma power less than 500 W. In some embodiments, the de-crust process is performed with a plasma power between 50 W and 500 W. In some embodiments, the de-crust process is performed with a pressure less than 150 mT. In some embodiments, the de-crust process is performed with a pressure between 10 mT and 150 mT. In some embodiments, the de-crust process is performed for a time period of less than 120 s. In some embodiments, the de-crust process is performed for a time period between 30 s and 120 s.

Referring to FIG. 4, the method 400 proceeds to operation 414 by removing the de-cross link BL. FIG. 3G shows removal of the de-cross link BL 311'. In some embodiments, the de-cross link BL 311' is removed with a wet process. In some embodiments, the wet process for removing the de-cross link BL 311' employs solvent-based chemistries that include water. In some embodiments, the water content in the solvent for removing the de-cross link BL 111' is less than 20%. In some embodiments, the solvent can be mixed with hydrogen peroxide ($H_2O_2$). In some embodiments, the solvent includes active components such as, for example, N-methyl-2-pyrrolidone, cyclohexanone, tolunitrile, diethylene glycol, diethylene glycol monobutyl ether, diethylene glycol dimethyl ether, dimethyl sulfoxide, dimethylformamide, poly(ethylene glycol) bis(amine), (2-methylbutyl) amine, tri(2-ethylhexyl)amine, poly(ethylene glycol) methyl ether amine, poly(ethylene glycol) diamine, ammonium fluoride, hydrofluoric acid, potassium fluoride, pyrrolidine, acetone, methyl isobutyl ketone, propylene carbonate, 1-methoxy-2-propanol, dichloromethane, trichloroethylene, 1-chlorobenzotriazole, 5-chlorobenzotriazole, 1-methylimidazole, thiamazole, azole group with functional side chain, and/or $H_2O_2$. In some embodiments, the removal process of the de-cross link BL 311' removes the de-cross link BL 311'. The trenches 110 and via 115 are free of defects or residues. In some embodiments, the removal process of the de-cross link BL 311' does not damage the dielectric layer 104 or the under-layer conductor 102.

In some embodiments, the de-cross link process with the usage of a cross link BL also applies to a rework process for the lithography steps of forming the semiconductor structure (e.g., a via). In some embodiments, the rework process starts from a semiconductor structure illustrated by FIG. 1K. The rework process proceeds to remove the photoresist 113, the ML 112, and a portion of BL 111. A purpose of the rework process is to remove the existing patterns that may have issues during the lithography so that new patterns can be re-formed. In some embodiments, the removal of ML 112 includes using solvents such as, for example, PGMEA. In some embodiments, the cross link BL 111 is resistant to the solvents (e.g., PGMEA) used to remove the ML in the rework process. As a result, the rework process can remove the ML 112 with solvents including PGMEA without damaging the cross link BL.

The incorporation of a photoresist cross link and de-cross link processes in photolithography reduce the defects generated during the etching of an opening structure (e.g., a trench or a via), thus improving the yield and the reliability of the device. The photoresist cross link process increases the amount of cross linked polymers in the photoresist, making the photoresist less prone to generate defects during the etching process. The photoresist de-cross link process de-cross links the cross link photoresist so that the photoresist can be removed in a dry or wet stripping process. In addition, the incorporation of a photoresist cross link and a photoresist de-cross link process is a cost effective solution. Cross link photoresist (e.g., bottom layer) is resistant to solvents (e.g., PGME or PGMEA) used in a subsequent photoresist (e.g., middle layer) process, eliminating the need to perform additional hardening treatment steps to protect the photoresist layer. The reduction in process steps results in cost reduction in device fabrication.

In some embodiments, a method of fabricating a semiconductor structure includes forming a first opening in a dielectric layer on a substrate. The method further includes depositing a bottom layer (BL) over the first opening formed in the dielectric layer. The method further includes performing a first treatment on the BL. The method further includes forming a pattern above the treated BL. The method further includes etching into the dielectric layer and the treated BL to form a second opening. The method further includes performing a second treatment on the treated BL. The method further includes removing the BL treated by the second treatment.

In some embodiments, a method of fabricating a semiconductor structure includes forming depositing a photoresist layer over a trench formed in a dielectric layer. The method further includes performing a bake to form cross links in the photoresist layer. The method further includes forming a pattern above the photoresist layer. The method further includes de-cross linking the cross links formed in the photoresist layer. The method further includes etching into the dielectric layer and the photoresist layer to form a via. The method further includes removing the photoresist layer.

In some embodiments, a method of fabricating a semiconductor structure includes forming a first structure in a dielectric layer on a substrate. The method further includes depositing a bottom layer (BL) over the first structure formed in the dielectric layer. The method further includes cross linking the BL with a first bake. The method further includes forming a pattern above the BL. The method further includes etching into the dielectric layer to form a second structure. The method further includes de-cross linking the BL with a vacuum ultraviolet (VUV) radiation. The method further includes removing the BL with a wet etching process.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The foregoing disclosure outlines features of several embodiments so that a person of ordinary skill in the art may better understand the aspects of the present disclosure. A person of ordinary skill in the art will appreciate that they may readily use the present disclosure as a basis for designing or modifying other processes and structures for carrying out the same purposes and/or achieving the same advantages of the embodiments introduced herein. A person of ordinary skill in the art will also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, the method comprising:
    forming a first opening in a dielectric layer disposed on a substrate;
    depositing a bottom layer (BL) over the first opening;
    performing a first treatment on the BL;
    forming a pattern above the first-treated BL;
    etching the dielectric layer and the first-treated BL to form a second opening;
    performing a second treatment on the first-treated BL; and
    removing the second-treated BL.

2. The method of claim 1, wherein the second treatment comprises a vacuum ultraviolet (VUV) radiation.

3. The method of claim 2, wherein the VUV radiation has a wavelength between 172 nm and 283 nm.

4. The method of claim 2, wherein the VUV radiation has an energy between 100 mJ and 800 mJ.

5. The method of claim 2, wherein the VUV radiation has an exposure time between 60 s and 180 s.

6. The method of claim 2, wherein the second treatment comprises:
    a bake at a temperature between 250° C. and 350° C. for a time period between 60 s and 180 s.

7. The method of claim 1, wherein the bottom layer comprises a methacrylate-based photoresist.

8. The method of claim 1, wherein the depositing the BL comprises depositing the BL with a spin coating process, a chemical vapor deposition (CVD) process, a plasma enhanced chemical vapor deposition (PECVD) process, or an atomic layer deposition (ALD) process.

9. The method of claim 1, wherein the first treatment comprises a bake at a temperature between 250° C. and 350° C. for a time period between 60 s and 180 s.

10. The method of claim 1, wherein the first opening comprises a trench and the second opening comprises a via.

11. The method of claim 1, wherein the forming the pattern above the first-treated BL comprises:
    forming a middle layer (ML) over the first-treated BL;
    forming a photoresist layer over the ML; and
    patterning the photoresist layer with photolithography.

12. A method of fabricating a semiconductor structure, the method comprising:
    depositing a photoresist layer over a trench;
    performing a bake to form cross links in the photoresist layer;
    forming a pattern above the photoresist layer;
    de-cross linking the cross links formed in the photoresist layer;
    etching into the dielectric layer and the photoresist layer to form a via; and
    removing the photoresist layer.

13. The method of claim 12, wherein the de-cross linking the cross links formed in the photoresist layer comprises performing a vacuum ultraviolet (VUV) radiation with a wavelength between 172 nm and 283 nm.

14. The method of claim 12, wherein the bake to form cross links in the photoresist layer is performed at a temperature between 250° C. and 350° C. for a time period between 60 s and 180 s.

15. The method of claim 12, wherein the etching into the dielectric layer and the photoresist layer to form the via comprises performing one or more cycles of etching steps and de-crust steps, wherein each cycle comprises at least one etching step and at least one de-crust step, and wherein the etch step etches the photoresist and the de-crust step removes carbon-based defects formed during the etching step.

16. A method of fabricating a semiconductor structure, the method comprising:
    forming a first structure in a dielectric layer disposed on a substrate;
    depositing a bottom layer (BL) over the first structure;
    cross linking the BL with a first bake;
    forming a pattern above the BL;
    etching into the dielectric layer to form a second structure;
    de-cross linking the BL with a vacuum ultraviolet (VUV) radiation; and
    removing the BL with a wet etching process.

17. The method of claim 16, wherein the first structure comprises a trench and the second structure comprises a via.

18. The method of claim 16, wherein the VUV radiation has a wavelength between 172 nm and 283 nm and an energy between 100 mJ and 800 mJ.

19. The method of claim 16, wherein the BL comprises a methacrylate-based photoresist.

20. The method of claim 16, wherein the de-cross linking the BL further comprises treating the BL with a second bake.

* * * * *